United States Patent [19]
Kawabata et al.

[11] Patent Number: 5,262,729
[45] Date of Patent: Nov. 16, 1993

[54] METHOD OF MEASURING CHARACTERISTICS OF ELECTRONIC PARTS

[75] Inventors: Shoichi Kawabata; Norio Sakai; Kenji Minowa; Akihiko Takahashi; Miki Kurabe; Mitsuro Hamuro, all of Kyoto, Japan

[73] Assignee: Murata Manufacturing Co., Ltd., Japan

[21] Appl. No.: 830,707

[22] Filed: Feb. 4, 1992

[30] Foreign Application Priority Data

Feb. 5, 1991 [JP] Japan .................... 3-14534

[51] Int. Cl.⁵ .......................................... G01R 31/02
[52] U.S. Cl. .................... 324/548; 324/551
[58] Field of Search ................ 324/548, 551; 209/574

[56] References Cited

U.S. PATENT DOCUMENTS

| | | | |
|---|---|---|---|
| 3,761,806 | 9/1973 | Napor et al. | 209/574 |
| 3,930,993 | 1/1976 | Best et al. | 209/574 |
| 4,406,373 | 9/1983 | Braden | 209/574 |

FOREIGN PATENT DOCUMENTS 1264247 10/1986 U.S.S.R. .

*Primary Examiner*—Kenneth A. Wieder
*Assistant Examiner*—Maura K. Regan
*Attorney, Agent, or Firm*—Ostrolenk, Faber, Gerb & Soffen

[57] ABSTRACT

In order to enable measurement of insulation resistance values of a number of electronic parts such as chip capacitors with high accuracy and without the reducing measurement efficiency of characteristics, such as the capacitance, capacitance values of chip capacitors which are held by respective holding portions of a turntable are first measured in a capacitance measuring position during intermittent feeding of the turntable. When an insulation resistance measuring region is filled with those of the chip capacitors whose capacitance values have been measured the turntable is stopped. In this stopped state, a plurality of chip capacitors being located in the insulation resistance measuring region are simultaneously charged and subjected to the measurement of insulation resistance values.

8 Claims, 2 Drawing Sheets

METHOD OF MEASURING CHARACTERISTICS OF ELECTRONIC PARTS

BACKGROUND OF THE INVENTION

1. Field of the Invention

The present invention relates to a method for measuring characteristics of electronic parts including at the measuring of insulating resistance of the electronic parts. More particularly, the present invention relates to a method of measuring insulation resistance values of electronic parts with a process of serially and intermittently carrying a plurality of electronic parts along a circulation path.

2. Description of the Background Art

In advance to the shipment of capacitors, for example, an inspection step is generally carried out for measuring electronic characteristics such as capacitance and insulation resistance, and the capacitors are selected on the basis of the results of such measurement.

A manufacturer shipping a large quantity of capacitors must efficiently carry out the aforementioned inspection step. FIG. 2 shows a characteristic measuring apparatus which is generally employed for measuring the characteristics of chip capacitors, for example.

Referring to FIG. 2, the characteristic measuring apparatus comprises a turntable 1, which is intermittently fed in the direction of an arrow 2. In the periphery of the turntable 1, a plurality of holding portions 3 are distributed at regular intervals for holding the chip capacitors individually A parts feeder 4 is adapted to supply a plurality of chip capacitors. When the turntable 1 is intermittently fed in the direction of arrow 2, therefore, the chip capacitors are successively supplied to the respective holding portions 3 one by one from a supply position 5.

The characteristics of the chip capacitors thus held by the holding portions 3 are measured in the following manner during intermittent feeding of the turntable 1.

First, capacitance values are measured at a capacitance measuring position 6.

Then, the chip capacitors are charged in a charge region 7. Thereafter insulation resistance values of the charged chip capacitors are measured in a measuring position 8. Then the charges stored in the chip capacitors are discharged in a discharge portion 9.

The chip capacitors held by the holding portions 3 are then selected on the basis of the results of the aforementioned characteristic measurement and removed at an outlet position 13.

In the aforementioned method of measuring the characteristics, however, the chip capacitors are merely intermittently charged in the charge region 7. This is because charging terminals come into contact with the chip capacitors only when the turntable 1 is stopped, and no contact is attained between the charging terminals and the chip capacitors during rotation of the turntable 1. Thus, charging efficiency is so deteriorated that the chip capacitors may not be completely charged. As a result, it may not be possible to measure the insulation resistance values with high accuracy.. In order to measure the insulation resistance values with high accuracy, the interval for intermittently feeding the turntable 1 must be increased. Thus, it is impossible to measure characteristics of a number of chip capacitors at a high speed. Such a tendency remarkably appears in the case of chip capacitors having particularly high capacitance values.

In order to obtain a long charging time, the area of the charge region 7 may be increased. In this case, however, it is not the size of the turntable 1 in view of area efficiency in the factory.

Further, since the charging time depends upon the provision of the charge region 7, it is impossible to undertake characteristic measurements of various types of chip capacitors. The above method also applies to the measurement of insulation resistance of inductors, LC filters like in addition to capacitors, while the characteristics to be measured may also include impedance, inductance and the like.

SUMMARY OF THE INVENTION

Accordingly, an object of the present invention is to provide a method for measuring the insulation resistance of electronic parts, which can solve the aforementioned problems.

The present invention is directed to a method of measuring various characteristics of electronic parts including at least the measurement of the insulation resistance of the electronic parts. In order solve the aforementioned technical problems, the inventive method comprises the steps of:

providing a circulation path for serially and intermittently carrying a plurality of electronic parts, successively supplying electronic parts to the circulation path from a first fixed position, stopping the carriage of the electronic parts upon arrangement of a prescribed number of electronic parts on the circulation path for simultaneously charging the plurality of electronic parts and measuring the insulation resistance values thereof, and selecting and removing the electronic parts, whose insulation resistance values have been measured, from the circulation path in a second fixed position.

According to the present invention, the insulation resistance of a plurality of electronic parts are simultaneously measured to, which necessarily requires at least a prescribed time for accurate measurement when the carriage of the electronic parts is stopped.

According to the present invention, therefore, it is possible to measure insulation resistance with high accuracy without reducing measurement efficiency. This feature is particularly advantageous for electronic parts such as chip capacitors having high capacitance values.

The charging time can be freely set in response to the type of electronic parts whose characteristics are measured. Therefore, it is possible to set an optimum charging time in response to each type of electronic parts, as well as to measure characteristics with the highest efficiency in response to the type of electronic parts.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
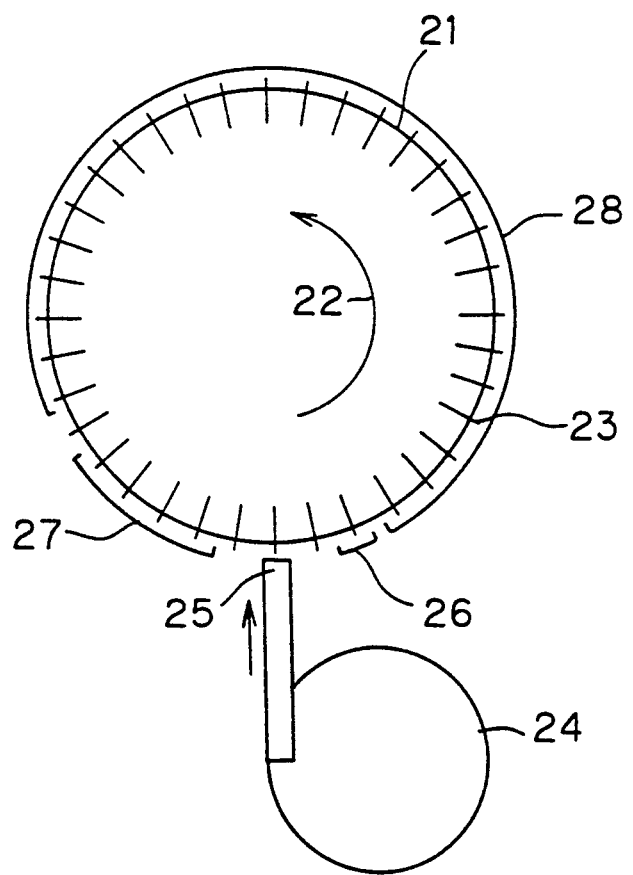
FIG. 1 is a plan view illustrating a characteristic measuring apparatus for carrying out an embodiment of the present invention.
Figure 2:
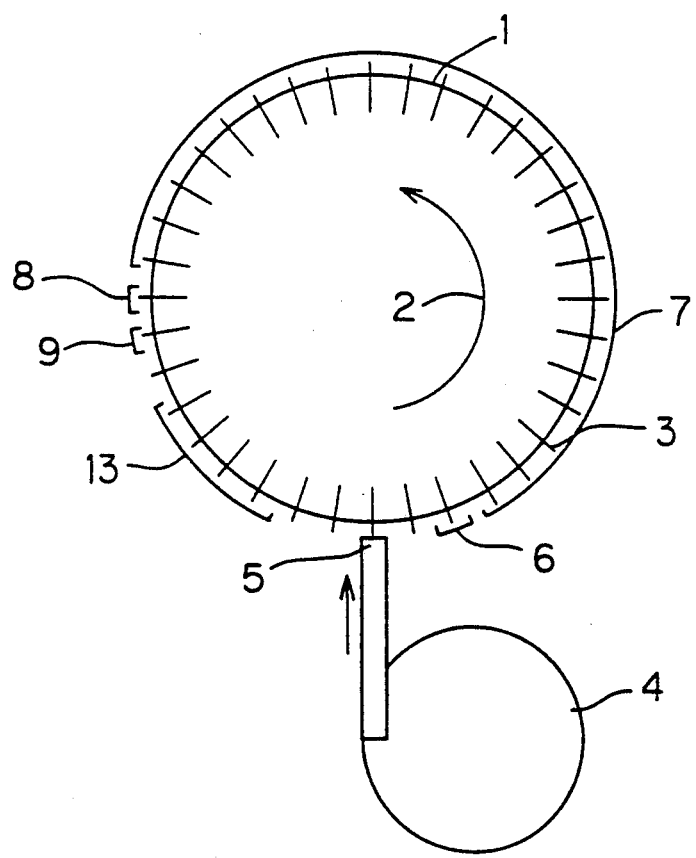
FIG. 2 is a plan view illustrating a conventional characteristic measuring apparatus.

FIG. 1 is a characteristic measuring apparatus for carrying out an embodiment of the present invention. While this embodiment is adapted to measure characteristics of chip capacitors in particular, the present invention is also applicable to the characteristic measurement of inductors, LC filters and the like, and the characteristics to be measured may include capacitance, impedance, inductance and the like, in addition to insulation resistance.

The characteristic measuring apparatus comprises a turntable 21, similar to the turntable of the conventional apparatus. Turntable 21 is intermittently fed in the direction indicated by arrow 22. In the periphery of the turntable 21, holding portions 23 are distributed at regular intervals for holding electronic parts of chip capacitors individually therein. Therefore, the turntable 21 provides a circulation path for serially and intermittently carrying a plurality of chip capacitors.

Similarly to the conventional apparatus, the chip capacitors are supplied from a parts feeder 24, to be successively fed from a fixed supply position 25 to the respective holding portions 23 one by one during intermittent feeding of the turntable 21.

While the turntable 21 is stepwisely moved the chip capacitors and fed into the respective holding portions 23 as described above. Those of the chip capacitors reaching a fixed capacitance measuring position 26 are subjected to the measurement of capacitance values and those whose capacitance and insulation resistance values are completely measured are selected and removed from the respective holding portions 23 in a fixed outlet position 27. Thus, no insulation resistance is measured during the intermittent rotation of the turntable 21.

An insulation resistance measuring region 28 is adapted to measure the insulation resistance. When the insulation resistance measuring region 28 is filled with those chip capacitors whose capacitance values have been measured, the turntable 21 is stopped for a prescribed time. According to this embodiment, twenty-seven holding portions 23 are distributed in the insulation resistance measuring region 28, so that twenty-seven chip capacitors can be simultaneously located in the insulation resistance measuring region 28.

The twenty-seven chip capacitors located in the insulation resistance measuring region 28 are simultaneously subjected to the measurement of insulation resistance. Namely, the chip capacitors are successively charged, subjected to measurement of insulation resistance, and discharged. The charging, measuring and discharging steps are preferably carried out while the chip capacitors are in contact with a common terminal. Therefore, the electric state of such a terminal is switched by a proper switching circuit.

When such measurement of insulation resistance is completed, intermittent feeding of the turntable 21 is again started. During such intermittent feeding, the chip capacitors are selected and removed from the outlet portion 27, while new chip capacitors whose capacitance will be measured in the capacitance measuring position 26 are supplied to the holding portions 23 from the supply position 25.

An operation similar to the above is then repeated.

Although the turntable 21 provides a circulation path for serially carrying a plurality of chip capacitors in the aforementioned embodiment, such a circulation path may alternatively be provided by an endless belt, for example.

Further, the capacitance measuring position 26 and the insulation resistance measuring region 28 may be reversed in order.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of measuring the capacitance and insulation resistance values of a plurality of electronic parts, comprising the steps of:
    providing means for serially and intermittently carrying said plurality of electronic parts along a circulation path;
    successively supplying said plurality of electronic parts to said carrying means from a fixed first position;
    carrying said plurality of electronic parts along said circulation path;
    successively and individually measuring the capacitance values of each of said plurality of electronic parts in a second fixed position;
    stopping the carriage of said plurality of electronic parts once a prescribed number of electronic parts has been received in said carrying means;
    simultaneously measuring the insulation resistance values of all of said plurality of electronic parts, while said plurality of electronic parts are simultaneously connected to a common terminal;
    and
    removing said plurality of electronic parts from said carrying means at a third fixed position.

2. A method of measuring the capacitance and insulation resistance values of electronic parts in accordance with claim 1, wherein said electronic parts supplied in the step of supplying comprise a plurality of chip capacitors.

3. A method of measuring the capacitance and insulation resistance values of electronic parts in accordance with claim 2, wherein said step of simultaneously measuring the insulation resistance values of said plurality of chip capacitors includes a step of charging said plurality of chip capacitors, a step of simultaneously measuring the insulation resistance values of said plurality of charged chip capacitors, and a step of discharging said plurality of measured chip capacitors, wherein said steps of charging, measuring, and discharging said chip capacitors occur while said plurality of chip capacitors are in contact with the common terminal.

4. A method of measuring the capacitance and insulation resistance values of electronic parts in accordance with claim 1, wherein said carrying means of said providing step comprise a turntable.

5. A method of measuring the capacitance and insulation resistance values of electronic parts in accordance with claim 1, further comprising a step of selecting said plurality of electronic parts whose insulation resistance values have been measured, and said step of removing comprises removing said selected plurality of electronic parts.

6. A method of measuring the capacitance and insulation resistance values of a plurality of chip capacitors, comprising the steps of:

providing means for serially and intermittently carrying said plurality of chip capacitors along a circulation path;

successively supplying said plurality of chip capacitors to said carrying means from a fixed first position;

carrying said plurality of chip capacitors along said circulation path;

successively and individually measuring the capacitance values of each of said plurality of chip capacitors in a second fixed position;

stopping the carriage of said plurality of chip capacitors once a prescribed number of said plurality of chip capacitors has been received in said carrying means;

simultaneously measuring the insulation resistance values of all of said plurality of chip capacitors, while said plurality of electronic parts are simultaneously connected to a common terminal;

and removing said plurality of chip capacitors from said carrying means at a third fixed position.

7. A method of measuring the capacitance and insulation resistance values of chip capacitors in accordance with claim 6, wherein said step of simultaneously measuring the insulation resistance values of said plurality of chip capacitors includes a step of charging said plurality of chip capacitors; a step of simultaneously measuring the insulation resistance values of said plurality of charged chip capacitors; and a step of discharging said plurality of measured chip capacitors;

wherein said steps of charging, measuring, and discharging said chip capacitors occur while said plurality of chip capacitors are in contact with the common terminal.

8. A method of measuring the capacitance and insulation resistance values of chip capacitors in accordance with claim 6, further comprising a step of selecting said plurality of chip capacitors whose insulation resistance values have been measured, and said step of removing comprises removing said selected plurality of chip capacitors.

* * * * *